United States Patent [19]

Nishimoto et al.

[11] Patent Number: 4,969,022
[45] Date of Patent: Nov. 6, 1990

[54] DYNAMIC RANDOM ACCESS MEMORY DEVICE HAVING A PLURALITY OF IMPROVED ONE-TRANSISTOR TYPE MEMORY CELLS

[75] Inventors: Shozo Nishimoto; Yasukazu Inoue; Hiroshi Kotaki, all of Tokyo, Japan

[73] Assignee: NEC Corporation, Tokyo, Japan

[21] Appl. No.: 171,094

[22] Filed: Mar. 21, 1988

[30] Foreign Application Priority Data

Mar. 20, 1987 [JP] Japan .................................. 62-67383
Mar. 20, 1987 [JP] Japan .................................. 62-67385

[51] Int. Cl.⁵ ..................... H01L 29/68; H01L 29/06; H01L 29/10
[52] U.S. Cl. .................... 357/23.6; 357/23.4; 357/23.11; 357/41; 357/51; 357/55; 357/59
[58] Field of Search ............... 357/23.6, 51, 55, 59 G, 357/59 K, 23.4, 23.11, 41

[56] References Cited

U.S. PATENT DOCUMENTS

| | | | |
|---|---|---|---|
| 4,794,434 | 12/1988 | Pelley, III | 357/23.6 |
| 4,801,989 | 1/1989 | Taguchi | 357/23.6 |
| 4,803,535 | 2/1989 | Taguchi | 357/23.6 |

FOREIGN PATENT DOCUMENTS

| | | | |
|---|---|---|---|
| 0108390 | 5/1984 | European Pat. Off. . | |
| 0149799 | 7/1985 | European Pat. Off. | 357/23.6 |
| 0154871 | 9/1985 | European Pat. Off. | 357/23.6 |
| 0201706 | 11/1986 | European Pat. Off. | 357/23.6 |
| 54-7888 | 1/1979 | Japan | 357/23.6 |
| 61-90395 | 5/1986 | Japan | 357/23.6 |
| 62-208662 | 9/1987 | Japan | 357/23.6 |

Primary Examiner—Andrew J. James
Assistant Examiner—Ngan Van Ngo
Attorney, Agent, or Firm—Sughrue, Mion, Zinn, Macpeak & Seas

[57] ABSTRACT

A dynamic random access memory device including one-transistor type memory cells each having a trench capacitor is disclosed. An impurity region of a conductivity type opposite to the substrate and having a net-like plane shape is provided in an inner portion of the substrate, and the impurity region is led-out at a part to the major surface of the substrate. A trench is formed in the substrate from the major surface into the impurity region so that a wall section of the trench is constituted by the impurity region. A dielectric film of the capacitor is formed on the wall section, and a capacitor electrode is formed on the dielectric film and connected to source or drain region of the transistor.

10 Claims, 9 Drawing Sheets

DYNAMIC RANDOM ACCESS MEMORY DEVICE HAVING A PLURALITY OF IMPROVED ONE-TRANSISTOR TYPE MEMORY CELLS

BACKGROUND OF THE INVENTION

The present invention relates to a dynamic random access memory (DRAM) device having a plurality of one-transistor type memory cells, and more particularly to a DRAM device having trench capacitors in respective memory cells.

A memory cell composed of a single MOS transistor and a single capacitor has been widely used to realize a high integration of the memory device. Further, to reduce an area of the capacitor, a method has been proposed in which a trench is dug in a silicon substrate and a capacitor, that is called a trench capacitor, is formed by making use of an side wall surface and a bottom wall surface of this trench. The memory cell can realize a high integration since the side wall of the groove is utilized as the capacitor section. However, depletion layers extending from the trenches of respective memory cells in their operation would cause a punch-through phenomenon between trenches. Therefore, the interval between trenches cannot be shorter, and further high integration is restrained. As a countermeasure of the problem, two kinds of memory devices have been proposed in EUROPEAN PATENT APPLICATION Publication number 0 108 390. As one memory device, a high impurity region (P+-type region) of the same conductivity type as that of a semiconductor substrate (P-type substrate) is provided outside the trench so that the P+-type impurity region forms the entire wall of the trench from the bottom to the major surface of the substrate, and a source or drain region of the transfer gate transistor is connected to a conductive material (capacitor electrode) filled within the trench via a dielectric film. This construction can prevent the unfavorable punch-through phenomenon between trenches. However, in the operation, a minute depletion layer is inevitably produced between the dielectric film and the trench wall, that is, the P+-type region, and therefore the capacitance per unit wall area is decreased. In the other kind of devices, the P+-type region mentioned above is replaced by an N+-type region. The changed construction can also prevent the punch-through phenomenon between trenches. Further, any depletion layer is not produced between the trench wall, that is, the N+-type region and the dielectric film, and therefore the reduction of the capacitance does not occur. However, the N+-type regions in respective memory cells should not be a floating state, that is, they must be connect to a fixed potential line such as a ground potential. Therefore, in the prior art, the substrate consists of an N-type silicon body and a P-type epitaxial silicon layer formed on the N-type silicon body. The transfer gate transistors are provided on the P-type epitaxial silicon layer, and the trench capacitors are provided such that trenches are formed from the front major surface of the P-type epitaxial silicon layer, that is, the front major surface of the substrate per se to the N-type silicon body through the P-type epitaxial silicon layer, and that the N+-type regions are formed at the entire wall of the respective trenches from the major surface of the epitaxial silicon layer into the N-type silicon body. Therefore, to the respective N+-type regions of the capacitors a fixed potential such as ground potential can be applied through the N-type silicon body. However, in the prior art, a back-gate-bias voltage of, for example, minus (−) 3 volt, which controls the threshold voltage of the transistors (N-channel type transistors), cannot be supplied to the back major surface of the substrate because of existing entirely the N-type silicon body. On the other hand, when the back-gate-bias voltage is applied from some contact portions of the front major surface of the P-type epitaxial silicon layer, an adequate and uniform voltage cannot be supplied to all of the transfer gate transistors in the memory device, because the P-type epitaxial silicon layer in which the transfer gate transistors are provided has a low impurity concentration, that is, a high specific resistivity of, for example, 10 to 20 Ω-cm. If the number of the contact portions on the front major surface would be increased to that of the memory cells to reduce the electric resistance between each contact portion and the corresponding transistor and to supply an adequate and uniform back-gate-bias voltage to respective transfer transistors in the memory device, the integration would decrease to the extent of unpractical degree. Further, in the prior art structure, the isolation between the N+-type source or drain region of the transfer gate transistor and the N+-type region of the trench capacitor depends on only an insulating layer on the front major surface because both of the N+-type source or drain region of the transistor and the N+-type region of the capacitor are formed on and from the front major surface. Therefore, a higher integration cannot be expected because a necessary isolation-distance depends only on the front major surface of the substrate.

SUMMARY OF THE INVENTION

Accordingly, one object of the present invention is to provide a DRAM device which can realize a high integration density with a high capacitance, and can supply a back-gate-bias voltage of an adequate level to all of transfer gate transistors of respective memory cells, uniformly.

Another object of the present invention is to provide a DRAM device which can reduce or eliminate a distance along the front major surface of the substrate between the transfer gate transistor and the trench capacitor to enhance the integration density by preventing a formation of the unfavorable depletion layer along the trench during the operation, and can supply an adequate and uniform back-gate-bias voltage to all of the transfer gate transistors of the respective memory cells.

According to the present invention, there is provided a DRAM device which comprises a semiconductor substrate of one conductivity type and having front and back major surfaces, an impurity region of a conductivity type opposite to the substrate and formed in an inner portion of the substrate having a net-like plane shape, means for leading out a part of the impurity region to a portion of the front major surface of the substrate, and a plurality of memory cells each having a transfer gate transistor and a trench capacitor. The transfer gate transistor includes a pair of source and drain regions of a conductivity type opposite to the substrate and formed on the front major surface of the substrate. The trench capacitor includes a trench formed in the substrate from the front major surface into the impurity region such that a section of the wall of the trench is constituted by the impurity region, a dielectric film formed on the section of the wall of the trench and a capacitor electrode formed on the dielectric film within the trench and electrically connected to one of the source and drain regions of the transfer gate transistor. According to the present invention, the back-gate-bias voltage can be applied to the back major surface of the substrate of one conductivity type because the impurity region of opposite conductivity type has a net-like plane shape or a chain-like plane shape, and an adequate voltage level of the back-gate-bias can be supplied uniformly in all memory cells in a memory device. On the other hand, the specific resistivity of the impurity region of net-like shape can be low, for example, 1 Ω-cm, and therefore a fixed potential can be uniformly supplied to all trench capacitors in the memory cell through the leading-out means. The bottom wall of the trench and a lower side wall adjacent to the bottom wall of the trench may be constituted by the impurity region. As the leading-out means, it may include a conductive material such as a doped polycrystalline silicon connecting the part of the impurity region and an electrode on the front major surface of the substrate. Further, the leading-out means may be an insulated gate field effect transistor construction such that it includes a groove provided from the front major surface of the substrate to the impurity region adjacent to a part of the impurity region, a thin insulating film covering an entire wall of the groove, a conductor material formed on the thin insulating film within the groove, a semiconductor region having a conductivity type opposite to the substrate and formed on the front major surface of the substrate and adjacent to the groove, means for applying a voltage to the conductor material to form an inversion layer of a conductivity type opposite to the substrate along the groove between the semiconductor region on the front major surface of the substrate and the part of the impurity region in the substrate, and means for applying a fixed potential to the semiconductor region. The construction can be fabricated with the memory cells. When an upper side wall of the trench between the front major surface and a lower side wall is constituted by a highly doped impurity region of the one conductivity type and having a higher impurity concentration than the impurity concentration of the substrate, and/or an insulating layer having a thickness thicker than that of the dielectric film is provided on the upper side wall of the trench, a higher integration device can be expected. This is because the thick insulating layer and/or the highly doped impurity region serve as an isolation region provided along the trench for isolating the source or drain region of the transistor and the impurity region of the trench capacitor from each other.

DESCRIPTION OF EMBODIMENT

First Embodiment

Figure 1A:
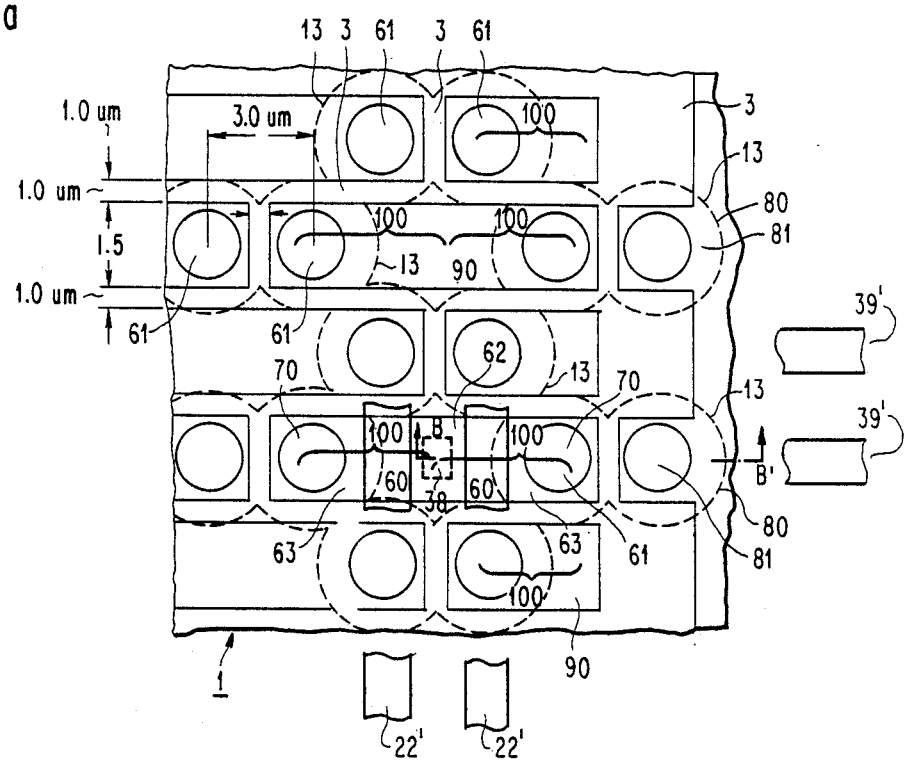
FIG. 1A is a schematic plan view showing a first embodiment of the present invention.

Referring to FIG. 1A, a plurality of memory cells 100 are formed in respective active regions 90 of a P-type silicon substrate 1 surrounded by a thick insulating layer 3. Each memory cell 100 comprises a transfer gate transistor 60 and a trench capacitor 70 provided in a trench 61. The transistor 60 includes N+-type source and drain regions 62, 63, and the region 62 is connected to a bit line 39' at a contact portion 35 and the region 62 is coupled to the trench capacitor 70. Two of leading-out means 80 of insulated gate transistor type are provided at grooves 81. An N+-type ring-plan shape impurity region 13 extends from a lower side wall and a bottom wall of each of the trenches 61 and grooves 81, and respective impurity regions 13 are contacted to adjacent ones at their outer parts thereby forming a chain-like plane construction or a net-like plane shape as indicated by dot lines in FIG. 1A. The circular plan shape of the trench 61 and the groove 81 has a diameter of 1.5 μm, and some other typical dimensions are exemplified in μm in FIG. 1A. The N+-type region 13 is not provided under the channel regions of the transistors. The N+-type regions 13 of the trench capacitors are connected to each other and to the N+-type regions 13 of the means 80 and through the means 80 a fixed voltage such as the ground potential is applied from the front major surface of the substrate 1 to the respective N+-type regions 13.

Figure 1B:
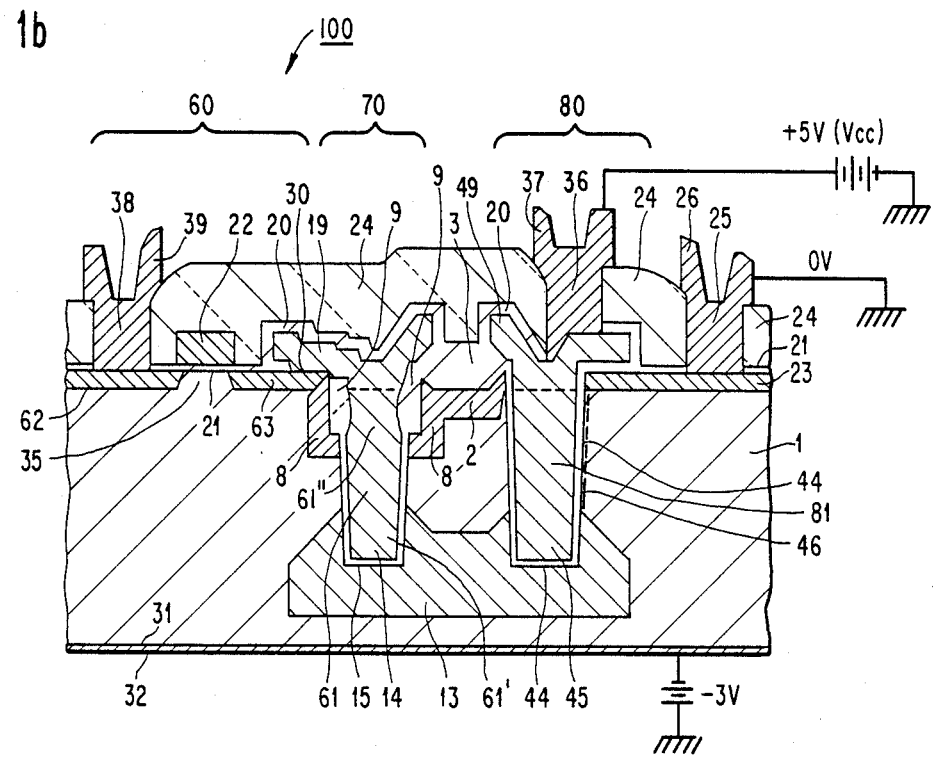
FIG. 1B is an enlarged cross-sectional view taken along line B—B' in FIG. 1A as viewed in the direction of arrows.

Referring to FIG. 1B, the P-type silicon substrate 1 of a high specific resistivity of, for example, 10 to 20 Ω-cm has a front major surface 30 and a back major surface 31. The transfer gate transistor 60 includes a pair of N+-type source and drain regions 62, 63, a channel region 35 between the source and drain regions, a gate insulating film 21 formed on the channel region 35, and a gate electrode 22 formed on the gate insulating film and coupled to the word line 22' (FIG. 1A). A metallic electrode wiring 39 of, for example, aluminum is contacted to the region 62 through a contact hole 38 provided in a passivation layer 24 of phosphosilicate glass, and the wiring electrode 39 is coupled to a bit line 39' (FIG. 1A). An upper side wall of an upper portion 61" of the trench 61 is formed by a P+-type impurity region 8 of higher impurity concentration than the P-type substrate 1, and a thick silicon oxide layer 9 is provided on the P+-type impurity region 8 and surrounds the upper portion 61" of the trench 61. From a lower side wall to a bottom wall of a lower portion 61' of the trench 61 a thin insulating film 15 used as a dielectric film of the trench capacitor is formed, and a first polycrystalline silicon layer 14 doped with N-type impurity and used as a capacitor electrode is filled in the trench 61. A second polycrystalline silicon layer 19 doped with N-type impurities is connected to the first silicon layer 14 and the N+-type source or drain region 63 to couple the transfer gate transistor 60 to the trench capacitor 70. By interposing the thick field silicon oxide layer 3 and a P+-type channel stopper region 2, the lead-out means, that is, connecting means 80 is provided. The means 80 includes a groove 81, a thin insulating film 44 and a third polycrystalline silicon layer 45 doped with N-type impurities, a fourth polycrystalline silicon layer 49, an N+-type impurity region 23, a first electrode 37 connected to the fourth silicon layer 49 through a contact hole 36 provided in the passivation layer 24 and a thermal silicon oxide film 20, and a second electrode 26 connected to the N+-type region 23 through a contact hole 25 provided in the passivation layer 24 and a thermal silicon oxide film 21. The N+-type impurity regions 13 are provided along the lower side walls and the bottom wall of the trenches 61 and of the grooves 81 and contacted to each other at their outer portions to form a chain-like construction mentioned above in FIG. 1A. In the embodiment, the N+-type impurity region 13 is not provided under the channel region 35 of the transfer gate transistor 60. Therefore, when a back-gate-bias voltage, for example, of minus (—) 3 volt is applied to a back electrode 32 which is entirely formed at the back major surface 31 of the P-type substrate in ohmic contact, the voltage can be effectively supplied to all of the transistors. The back major surface 31 of the substrate may be in direct ohmic contacted with a package without interposing the back electrode. The capacitor has a major capacitance by the N+-type region 13, the thin insulating film 15 and the first silicon layer 14, and an auxiliary capacitance by portions of the P-type substrate 1 and the P+-type region 8 abutted against the thin insulating film 15, the thin insulating film 15 and the first silicon layer 14. The N+-type region 63 of the transistor 60 and the drain region 13 of the capacitor 70 can be effectively separated by the thick insulating layer 9 and the P+-type region 8, and these layer 9 and region 8 are provided around the upper portion 61'' of the trench 61 for enhancing the integration of the device. On the other hand, the first electrode 37 is connected, for example, to a Vcc line of +5 volt and the second electrode 26 is connected to a fixed potential line, for example, to an earth line, that is, ground potential line. Therefore, an N-type inversion layer 46 is produced along the groove 81 by the Vcc voltage in the third silicon layer 45, and the ground potential is supplied to the chain-like construction by the N+-type regions 13 through the N+-type region 23 and the N-type inversion layer 46. That is, the means 80 can be regarded as an insulated gate field effect transistor in which the regions 23, 13 are used as source and drain regions, a portion along the groove 81 as a channel region, the silicon layer 45 as a gate electrode and the thin insulating film 44 as a gate insulating film. The field effect transistor 80 can be manufactured with the memory cell. Namely, the insulating film 15 as the dielectric film of the trench capacitor in the trench 61 and the insulating film 44 in the groove 81 as the gate insulating film of the means 80 can be simultaneously formed, and an additional process for removing the insulating film in the groove 81 is not necessary. Therefore, the manufacturing cost is not substantially enhanced by the formation of the means 80.

Referring to FIGS. 2 to 11, a method of manufacturing the first embodiment is disclosed.

Figure 2:
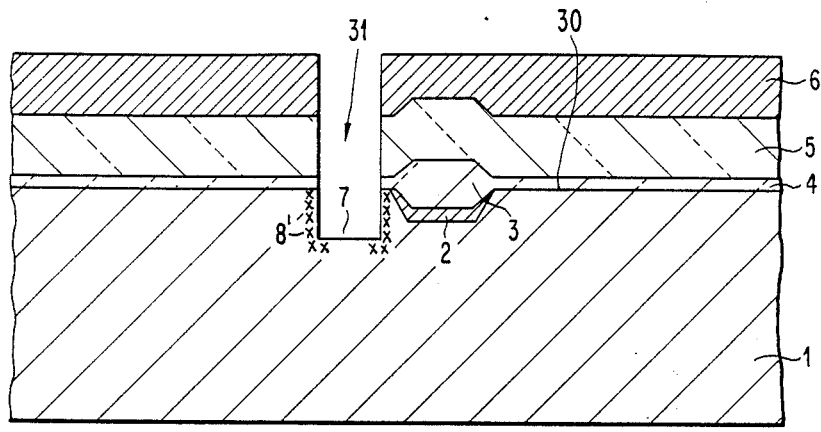
FIGS. 2 to 6 and 8 to 11 are cross-sectional views showing process steps in sequence for manufacturing the first embodiment of the present invention.
Figure 3:
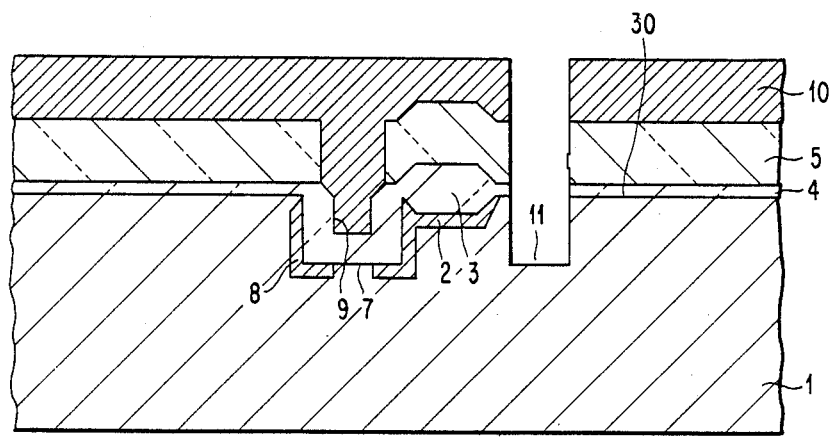
Figure 4:
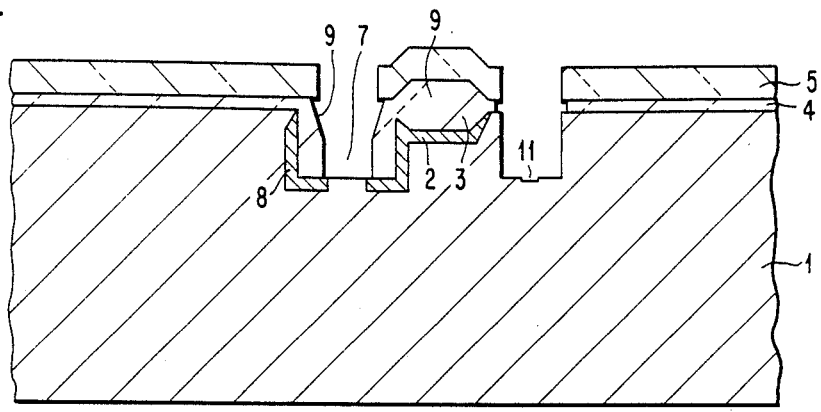
Figure 5:
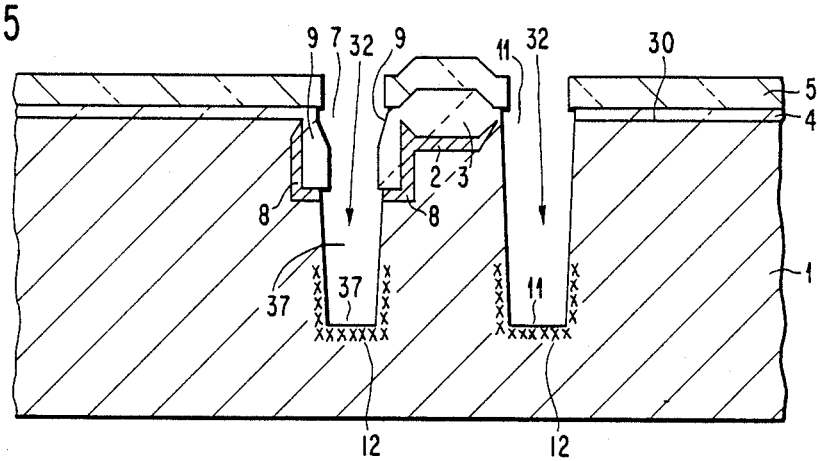
Figure 6:
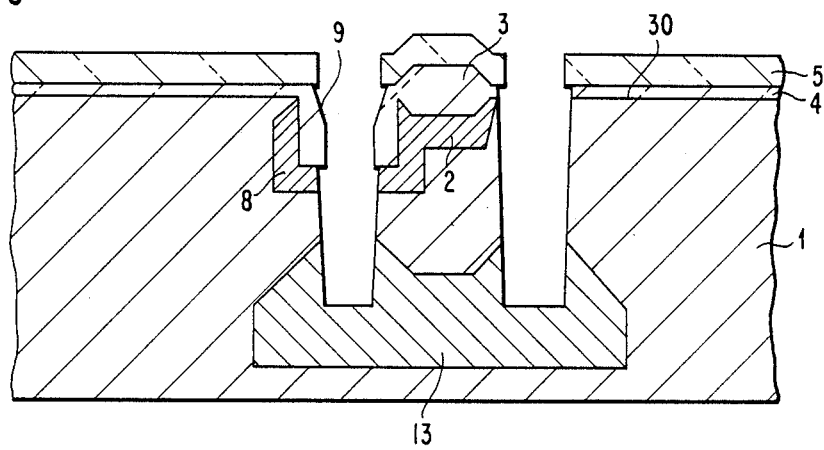
Figure 7:
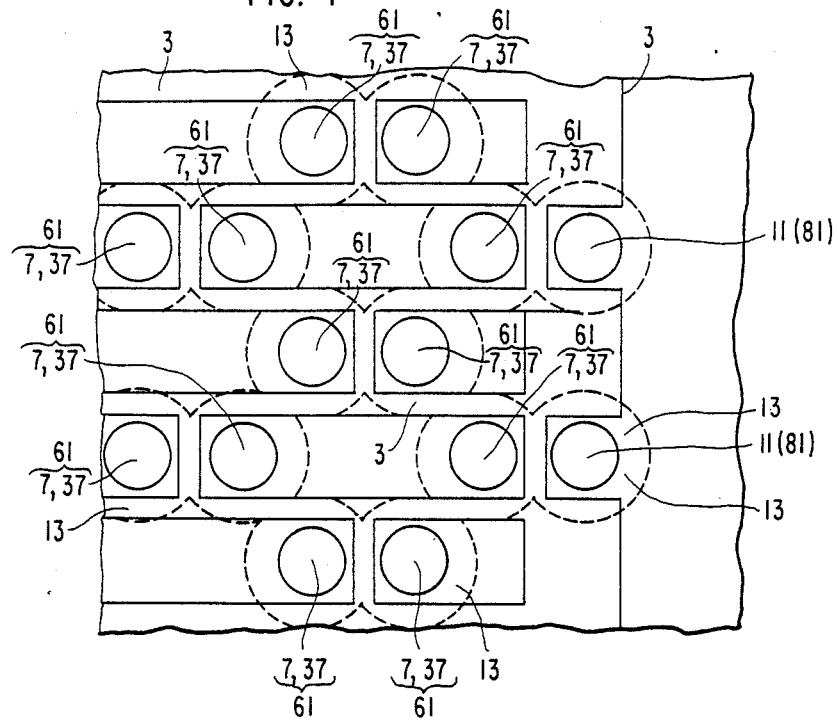
FIG. 7 is a plan view of FIG. 6.
Figure 8:
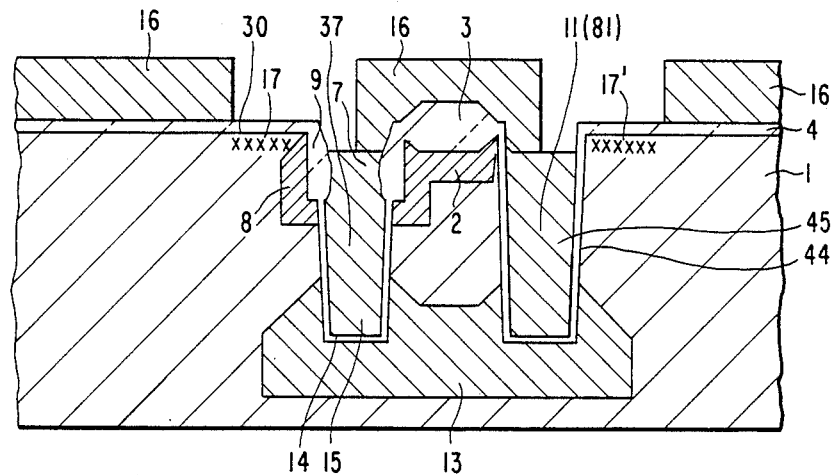
Figure 9:
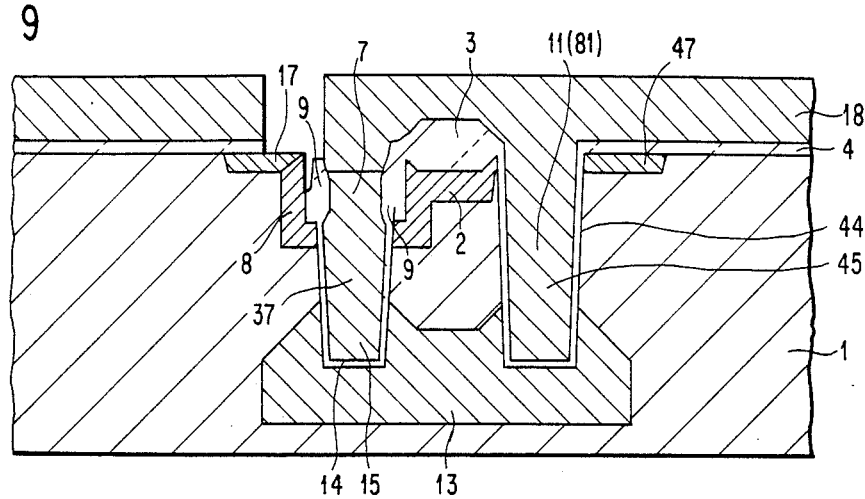
Figure 10:
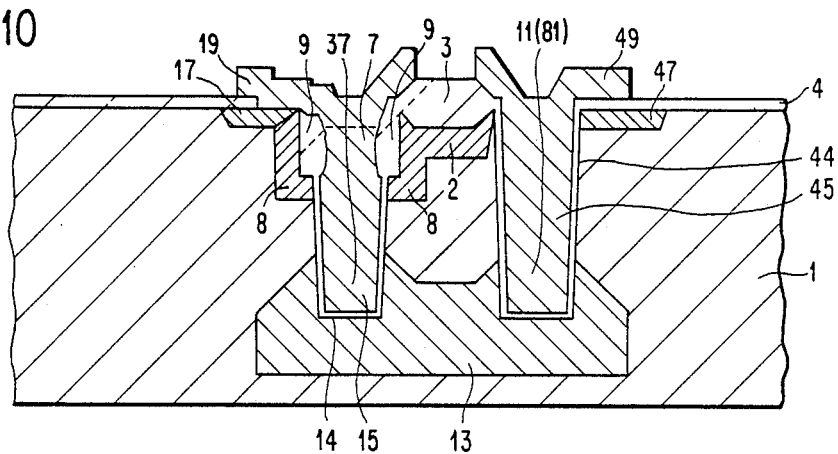
Figure 11:
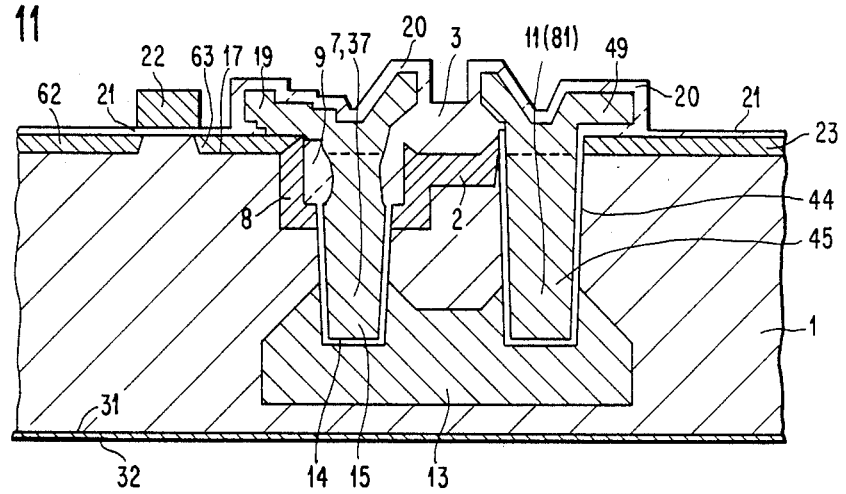

On a front major surface 30 of a P-type monocrystalline silicon substrate 1 having the specific resistivity of 10 to 20 Ω-cm an isolation region consisting of a P+-type channel stopper region 2 and a thick field insulating layer 3 of silicon dioxide ($SiO_2$) and having the thickness of 4000 to 6000 Å is selectively formed. Next, a silicon oxide film 4 of about 500 Å thickness is thermally grown and a silicon nitride film ($Si_3N_4$) 5 of 1 μm thickness is deposited by CVD method. By using a selectively formed photo-resist layer 6 as a mask, a reactive etching is conducted to form holes in the silicon nitride film 5 and the silicon oxide film 4 and to dig a first ditch 7 of 1.5 μm depth from the front major surface 30 in the silicon substrate 1. Next, an ion-implantation of boron ion is carried out to the first ditch 7 along a direction 31 inclined from the normal direction so that the boron ions 8' are predominantly doped at the side wall of the first ditch 7 (FIG. 2). During the boron ion-implantation, the substrate is horizontally rotated. After removing the photo-resist layer 6, a silicon oxide film 9 of 4000 to 8000 Å is thermally formed in the first ditch 7, and during the heat treatment the P+-region 8 is formed, and thereafter by using a newly formed photo-resist pattern 10 as a mask, a second ditch 11 of 1.5 μm depth from the front major surface 30 is formed in the substrate 1 through the same manner as forming the first ditch 7 (FIG. 3). After removing the photo-resist pattern 10, a plasma anisotropic etching is carried out to remove the portion of the silicon oxide film 9 under the hole of the silicon nitride film 5 and remain the portion of the silicon oxide film 9 at the side wall of the first ditch 7 (FIG. 4). Next, by using the silicon nitride film 5 and the remaining silicon oxide film 9 as a mask, a plasma etching of anisotropic is again conducted. Then, the second ditch 11 is deepened by 5 μm from the front major surface of the substrate 1 with the same area in FIG. 4, and under the first ditch 7 a third ditch 37 having a smaller area than the first ditch 7 is dug up to 5 μm from the front major surface 30 of the substrate 1. Thereafter, a phosphorus ion-implantation is carried out along the normal axis 32 to introduce the phosphorus ions 12 of $1 \times 10^{16}/cm^{-2}$ dosage in the bottom wall and lower side wall of both ditches under 100 KeV energy (FIG. 5). Next, a heat treatment of 950° C., 30 minutes under an inert gas environment is conducted to form an N+-type region 13 by the implanted phosphorus ions. As shown in FIG. 6, the N+-type regions 13 of the present invention are continuously formed between the ditches 11 and 37. Referring to FIG. 7, a plurality of ditches 7, 37 which are respective trenches 61 of the memory cells are provided, and two of ditches 11, that is, grooves 81 are exemplified. The first and third ditches 7, 37 in the manufacturing process steps constitute the trench 61 in FIGS. 1A, 1B, and the second ditch 11 in the process steps is the groove 81 in FIGS. 1A, 1B. The N+-type regions 13 shown in dotted lines are formed around the respective trenches and grooves such that each of the N+-type regions 13 has a ring-plan shape, and are connected to each other at their outer parts to form a chain-like plane construction, that is, a net-like plane shape. After removing the silicon nitride film 5, thin silicon oxide films 14, 44 of 250 Å thickness are formed at the side wall and bottom wall of the respective ditches (trenches and grooves), and the ditches are filled with phosphorus doped polycrystalline silicon layers 15, 45. By using a photo-resist pattern 16 as a mask, arsenic ions 17' are selectively introduced in the front major surface 30 of the substrate 1 by an ion-implantation method (FIG. 8). Next, a part of the silicon oxide film 4 is etched away by using the photo-resist pattern 18 as a mask to connect thereafter the N+-type region 17 by the arsenic ions 17' of the transfer gate transistor and the polycrystalline silicon in the ditches 7, 37 (FIG. 9). Next, N-type doped polycrystalline silicon layers 19, 49 are selectively formed and contacted to the N-type polycrystalline silicon layers 15, 45, respectively. The silicon layer 19 extends on and contacts to the N+-type region 17 which is a part of source or drain region of the transfer gate transistor of the memory cell (FIG. 10). An upper portion of the trench 61 consisting of the first and third ditches 7, 37 is surrounded by the isolation region consisting of the thick insulating layer 9 and the P+-type region 8 to separate the N+-type source or drain region of the transfer gate transistor from the N+-type region 13 of the capacitor. However, on the groove 81 consisting of the ditch 11, no isolation region is provided between the N+-type region 47 by N+-type ions 17' on the front major surface of the substrate 1 and the N+-type region 13 in the inner substrate. Next, by thermal oxidation, a gate insulating film 21 of silicon oxide is formed and an inter-layer insulating film 20 is provided A gate electrode 22 of a polycrystalline silicon and coupled to a word line is formed on the gate insulating film 21, and N+-type source and drain regions 62, 63, one of which is continuously connected to the previously formed N+-type region 17, are formed by the self-alignment manner with the gate electrode, and an N+-type region 23 is continuously formed with the N+-type region 47. A electrode layer 32 is ohmicly contacted to a back major surface 31 of the substrate 1 over the entire area for supplying a back-gate-bias through the electrode layer 32 to all memory cells in the operation (FIG. 11). After depositing the passivation layer 24 of phosphosilicate glass, electrodes 26, 37, 39, bit lines 39', word lines 22' and necessary wirings are formed to complete the memory device shown in FIGS. 1A, 1B.

Second Embodiment

Figure 12A:
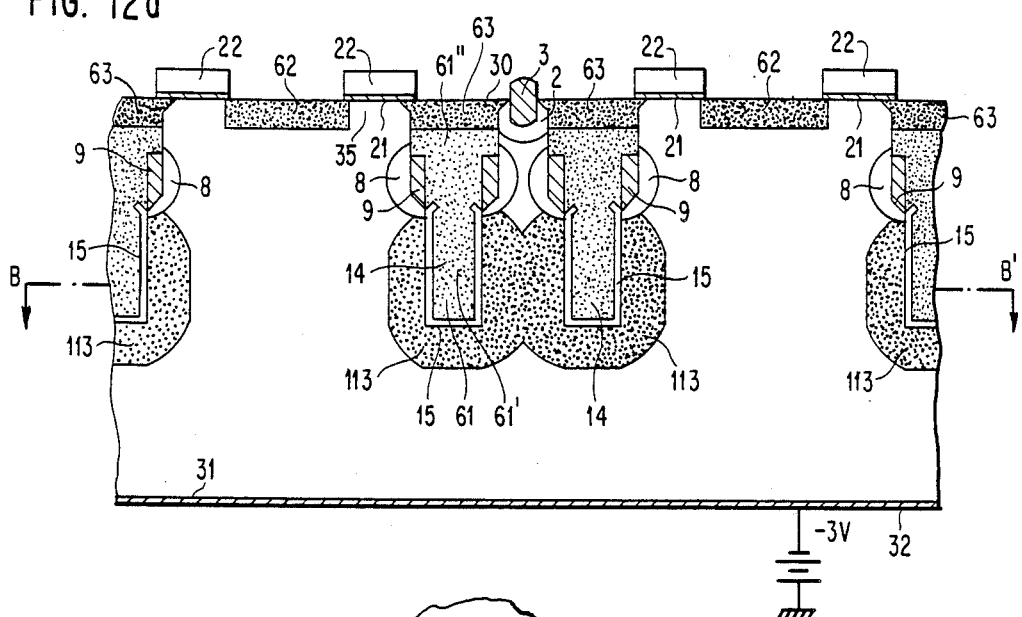
FIG. 12A is a cross-sectional view showing a second embodiment of the present invention.
Figure 12B:
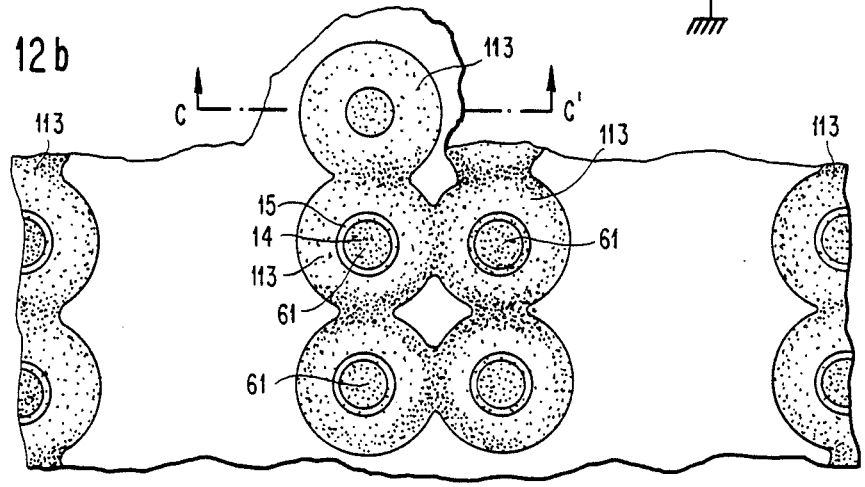
FIG. 12B is a cross-sectional view taken along a line B—B' in FIG. 12A as viewed in the direction of arrows.
Figure 12C:
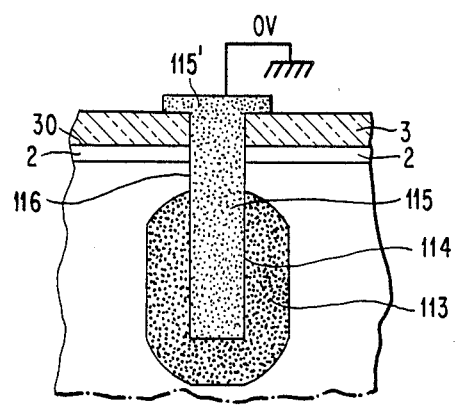
FIG. 12C is a cross-sectional view taken along line C—C' in FIG. 12B as viewed in the direction of arrows.

Referring to FIGS. 12A, 12B and 12C, the same components as those in FIGS. 1A and 1B in the first embodiment are indicated by the same reference numerals, and in these drawings, to avoid complication, well known bit lines, word lines, etc. are omitted as shown. In the second embodiment, an N+-type impurity region 113 (corresponding to the N+-type impurity region 13 in the first embodiment) is abutted against the P+-type region 8 such that the N+-type region 113 covers entirely the lower side wall and the bottom wall of the lower portion 61' of the first trench 61. Therefore, the trench capacitor has only a capacitance by the N+-type region 113, the thin insulating film 15 and the first polycrystalline silicon layer 14. Therefore, when other conditions such as dimensions, impurity concentrations, materials, etc. are the same as the first embodiment, the second embodiment can expect a higher capacitance. The ring-plan shaped N+-type impurity regions 113 are connected to each other to form a chain-like construction, that is, net-like plane construction as shown in FIG. 12B. The chain-like construction by the N+-type impurity regions 113 is led out to the front major surface 30 of the P-type substrate 1 directly by a conductive material 115 of polycrystalline silicon doped with N-type impurities through a groove 116 (FIG. 12C) without using the field effect transistor fashion 80 in the first embodiment. An electrode 115' is formed on the front major surface 30 of the substrate continuously with the conductive material within the groove 116, and through the electrode 115' and the conductive material 115 a fixed potential such as ground potential (0 Volt) is supplied to the net-like plane construction by the N+-type regions 113. The trenches 61 of the second embodiment are arranged along respective two columns running near each other and the net-like constructions by the N+-type regions 113 are formed in every pair of columns as shown in FIG. 12B. Therefore, the connecting means including the conductive material 114 and the groove 116 are provided in every net-like constructi. The N+-type impurity regions 113 are somewhat provided under the channel regions 35. However, the back-gate-bias voltage of minus (−) 3 volt from the back major surface 31 of the substrate 1 can be effectively supplied to respective channel regions 35 because a large P-type semiconductor section of the substrate is provided between the net-like constructions belonging to respective pairs of columns as shown in FIG. 12A.

Figure 13:
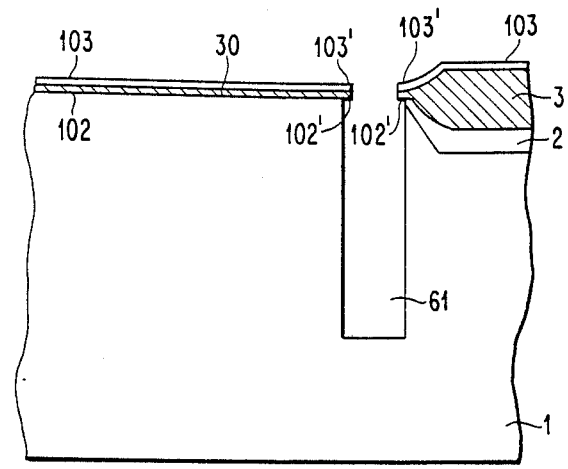
FIGS. 13 to 21 are cross-sectional views showing process steps in sequence for manufacturing the second embodiment of the present invention.
Figure 14:
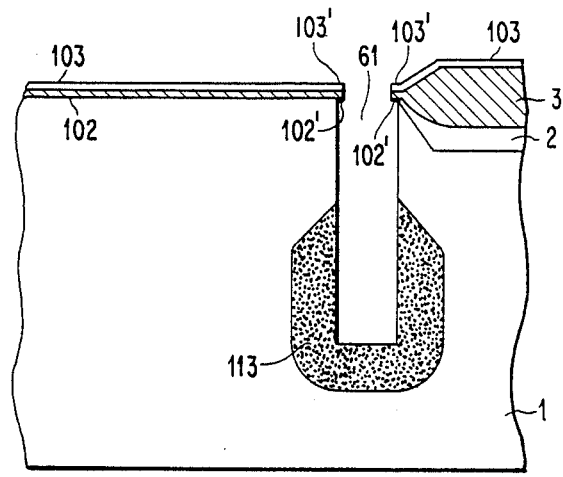

Referring to FIGS. 13 to 21, a method of manufacturing the second embodiment is disclosed. At first, after forming an isolation region consisting of a P+-type channel stopper region 2 and a thick field silicon oxide layer 3 on a P-type silicon substrate 1, a thin silicon oxide film 102 is formed on a front major surface 30 of the substrate 1 and a silicon nitride film 103 is formed over the entire area. A photo-resist pattern (not shown) is provided, and by using the photo-resist pattern as a mask, the films 103, 102 are selectively removed and circular plan shaped trenches 61 of 5.0 μm depth and 1.6 μm diameter are dug in the silicon substrate by a reactive plasma anisotropic etching method. By this process, eaves 102', 103' of these films 102, 103 are protruted by about 0.3 μm on the trench 61 (FIG. 13). Then, phosphorus ions are implanted in the trench inner wall in a region which extends from the bottom of the trench to a level corresponding to substantially ½ of the depth of the trench with the angle being adjusted by utilizing the eaves 102', 103' of the oxide and nitride films 102, 103 at the opening of the trench, and a heat treatment is carried out under the conditions of 1200° C. and nitrogen atmosphere thereby forming an N+ impurity region (substrate-side capacitor electrode) 113 which is continuous with the corresponding region of a trench 61 which is adjacent to the trench 61 and the groove 116 concerned (FIG. 14). The angle of the ion-implantation is of between the axis normal to the major surface of the substrate and the ion passage axis, and in this process, the angle is shifted from 0° to 6.8° with rotating the substrate 1 horizontally during the ion-implantation.

It should be noted that illustration of the adjacent trench is omitted in FIGS. 13 to 21 for the purpose of simplification. The relationship between the adjacent trench and the N+ impurity region has already been described with reference to FIGS. 12A to 12C.

Figure 15:
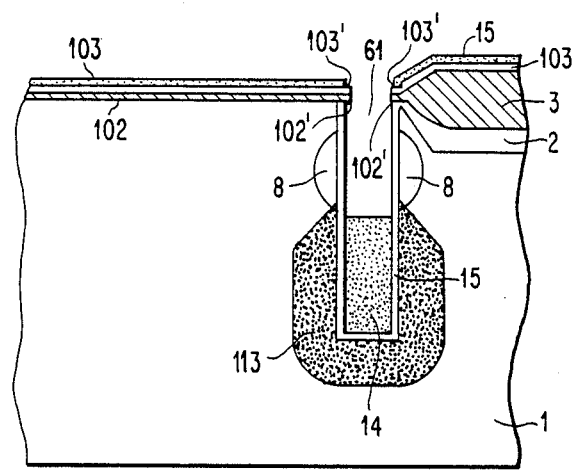
Figure 16:
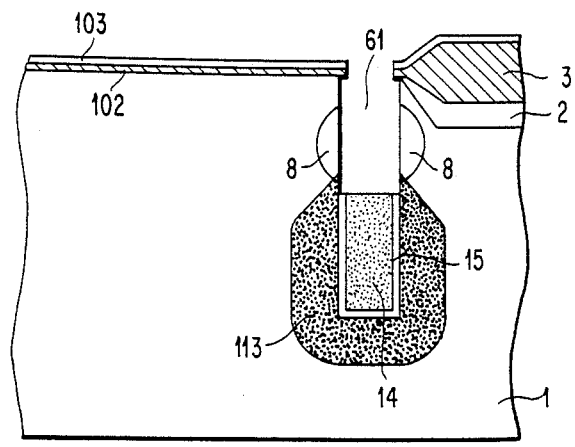
Figure 17:
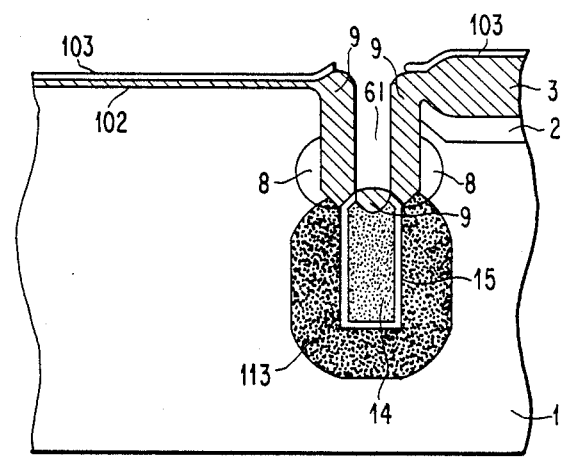
Figure 18:
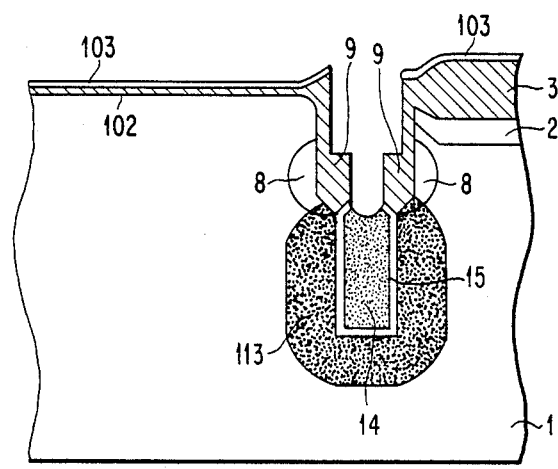
Figure 19:
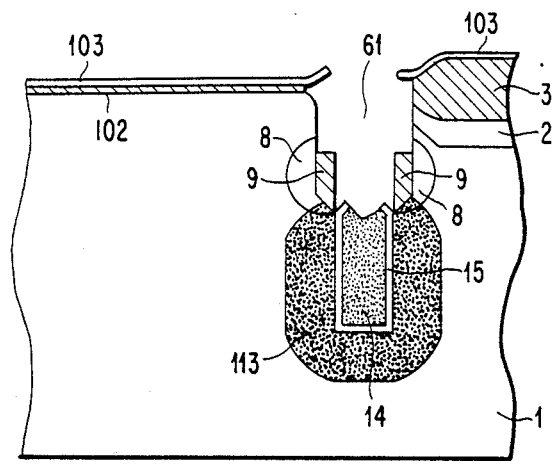
Figure 20:
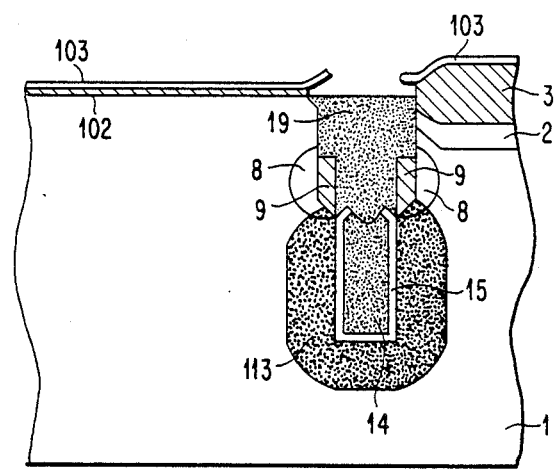
Figure 21:
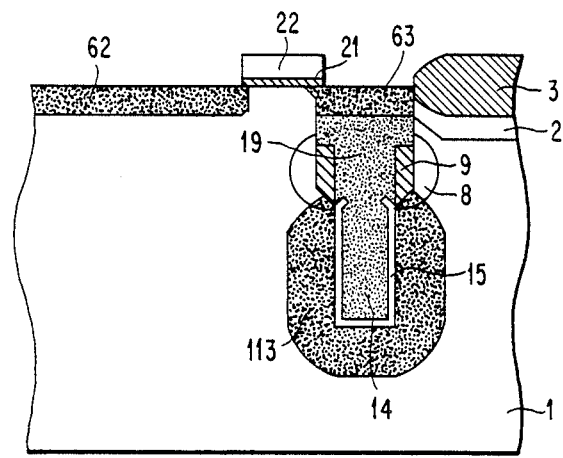

Next, an insulating film 15 having a three-layer structure which consists of an oxide film, a nitride film and an oxide film is formed on the inner wall of the trench 61, and the trench 61 is filled with a polycrystalline silicon doped with phosphorus. Then, anisotropic etching is carried out so that the polycrystalline silicon is left extending from the bottom of the trench to a level corresponding to substantially ½ the depth of the trench, thereby forming a first polycrystalline silicon 14. Then, boron ions are implanted into a region of the trench 61 which extends from a level corresponding to substantially ¼ of the depth of the trench 61 measured from the trench opening to a level corresponding to substantially ½ of the depth with the angle of 24° being adjusted by utilizing the eaves 102', 103' of the oxide and nitride films 102, 103 at the opening of the trench 61, thereby forming a P+-type impurity region 8 which serves as a channel stopper along the trench (FIG. 15). During the boron ion implantation, the substrate 1 is horizontally rotated. Next, the insulating film 15 in a region of the trench 61 which is not filled with the first polycrystalline silicon layer 14 is removed by etching to define a capacitor insulating film having a three-layer structure which consists of an oxide film, a nitride film and an oxide film (FIG. 16). Next, with the nitride film 103 on the surface of the silicon substrate 1 used as masks, silicon oxide films 9, 9' are formed respectively on the trench inner wall in a region which extends from the opening of the trench 61 to substantially ½ of the depth of the trench 61 and on the surface of the first polycrystalline silicon 14 (FIG. 17). Next, with the nitride film 103 on the silicon substrate 1 used as a mask, anisotropic etching is carried out to remove the oxide film in a region which extends from the trench opening to substantially ¼ of the depth of the trench 61 and also the oxide film 9' on the surface of the first polycrystalline silicon 14 (FIG. 18). Next, the silicon oxide film 102 and the silicon oxide film 9 are subjected to isotropic etching with a buffered hydrofluoric acid using the nitride film 103 on the surface of the substrate 1 as a mask so that the silicon oxide film 9 is left in a region which extends from a level corresponding to substantially ¼ of the depth of the trench 6 measured from the opening of the trench 61 to a level corresponding to substantially ½ of the depth, thereby defining a field oxide film 9 along the trench 61 (FIG. 19). Next, a region of the trench 61 which extends from the trench opening to substantially ½ of the depth of the trench 61 is filled with a second polycrystalline silicon layer 19 doped with N impurities, and with the silicon oxide and silicon nitride films 102, 103 on the substrate 1 used as a stopper, anisotropic etching is carried out to remove the polycrystalline silicon on the substrate surface, thereby forming a capacitor charge accumulation region 19, 14 (FIG. 20). Next, the silicon oxide and silicon nitride films 102, 103 on the substrate 1 are removed by etching, and a gate silicon oxide film 21, a gate electrode 22, and N+-type source and drain regions 62, 63 are formed by known methods (FIG. 21).

The groove 116 and the polycrystalline layer 115, 115' in FIG. 12C can be formed with the formation of the trench 61 and the capacitor electrode 14, 19, respectively. However, additional process steps of removing the dielectric film 15 from the groove 116 or, masking the groove 116 not forming the film 15 in the groove is necessary.

Thereafter, steps which are similar to those in the conventional process such as forming the back electrode 32 in ohmic contact on the back major surface 31 of the substrate and forming necessary electrodes, wirings including bit lines connected to respective source or drain regions 62 and word lines coupled to respective gate electrodes 22 are carried out to fabricate a MOS memory type integrated circuit.

What is claimed is:
1. A semiconductor memory device having a plurality of memory cells each including a transfer gate transistor and a trench capacitor, said memory device comprising:
a semiconductor substrate of a first conductivity type having front and back major surfaces;
a plurality of first trenches and at least one second trench formed in said substrate from said front major surface in an inward direction and each having a bottom and a side wall, said first trenches and said second trenches being arranged in an array form on said substrate;
each of said transfer gate transistors having source and drain regions of a second conductivity type opposite to said first conductivity type and a channel region formed on said front major surface of said substrate between said source and drain regions and adjacent to each said first trench;
a plurality of first impurity regions of said second conductivity type each having a ring shape and being formed at said bottom and a lower portion of said side wall of every first and second trench so that said first impurity region constitutes said bottom and said lower portion of said side wall, each of said first impurity regions being connected to each other at their peripheral side parts so that all of said first impurity regions belonging to said first and second trenches are electrically connected to each other, and said first impurity regions being substantially absent under said channel regions of said transfer gate transistors;
first insulating films formed on said bottom and on said lower portion of said side wall of said first trenches;
a second insulating film formed on said bottom and on said side wall of said second trench;
first electrodes comprising polycrystalline silicon and formed on said first insulating films within said first trenches, each of said first electrodes being isolated from said substrate of said first conductivity type, electrically connected to one of said source and drain regions of said transfer gate transistor, and leading-out to said front surface of said substrate;
a second electrode comprising polycrystalline silicon and formed on said second insulating film within said second trench;
a second impurity region of said second conductivity type formed on said front surface of said substrate and contacted to an upper portion of said side wall of said second trench so that a middle portion of said side wall is provided between said second impurity region and said first impurity region, said middle portion being of said first conductivity type;
whereby a trench capacitor of said memory cell is composed of said first impurity region as a first capacitor electrode, said first electrode as a second capacitor electrode and said first insulating film as a dielectric film; and
whereby a vertical transistor for leading-out said first electrodes of said trench capacitor is constructed at said second trench, said vertical transistors being constituted of said second impurity region as one of source and drain regions, said first impurity region as the other of source and drain regions, said middle portion of said side wall as a channel region, said second insulating film as a gate insulation film and said second electrode as a gate electrode.

2. A memory device of claim 1 in which an upper portion of said side wall of said trench capacitor is constituted by a third insulating film, having a thickness thicker than said dielectric film, and provided on said second capacitor electrode within said trench capacitor.

3. A memory device of claim 2 further comprising a highly doped impurity region of said first conductivity type provided on said third insulating film, having a higher impurity concentration than the impurity concentration of said substrate, and said highly doped impurity region acting as an isolation region.

4. A memory device of claim 1, in which said vertical transistor is an insulated gate field effect transistor providing leading-out means for said trench capacitor, said vertical transistor further comprising first and second metallic electrode wirings provided on the front surface of said semiconductor substrate, said first metallic electrode providing means for applying a voltage to said gate electrode of said vertical transistor and said second metallic electrode providing means for applying a fixed potential to said second impurity region.

5. A semiconductor memory device having a transfer gate translator, a trench capacitor coupled to said transfer gate transistor to form a dynamic random access memory cell, and a vertical transistor for leading-out one capacitor electrode of said trench capacitor, said memory device comprising:

a semiconductor substrate of a first conductivity type having a major surface;

first and second trenches formed in said substrate from said major surface inwardly, said second trench being positioned a defined distance from said first trench and each trench having a bottom and a side wall;

said transfer gate transistor having source and drain regions of a second conductivity type opposite to said first conductivity type and a channel region between said source and drain regions, and formed on said major surface of said substrate near said first trench;

a first impurity region of said second conductivity type selectively formed at inner parts of said substrate such that lower portions of said side walls of said first and second trenches and said bottom of said first and second trenches are constituted of said first impurity region, said first impurity region is continuously provided between said lower portions of said side walls of said first and second trenches, and that said first impurity region is substantially absent under said channel region of said transfer gate transistor;

a first insulating film formed on said bottom and on said lower portion of said side wall of said first trench;

a second insulating film formed on said bottom and on said side wall of said second trench;

a first electrode made of polycrystalline silicon and formed on said first insulating film within said first trench, said first electrode being isolated from said substrate of said first conductivity type, connected electrically to one of said source and drain regions of said transfer gate transistor, and leading-out to said major surface of said substrate;

a second electrode made of polycrystalline silicon and formed on said second insulating film within said second trench;

a second impurity region of said second conductivity type formed on said major surface of said substrate and in contact with an upper portion of said side wall of said second trench so that a middle portion of said side wall of said second trench is provided between said second impurity and said first impurity region, said middle portion being of said first conductivity type;

whereby said trench capacitor of said memory cell is composed of said first impurity region as a first capacitor electrode, and a first electrode as a second capacitor electrode and a first insulating film as a dielectric film and;

whereby a vertical transistor for leading-out said trench capacitor is constructed at said second trench, said vertical transistor being constituted of said second impurity region as one of source and drain regions, said first impurity region as the other of source or drain regions, said middle portion of said side wall as a channel region, said second insulating film as a gate insulating film and said second electrode as a gate electrode.

6. A memory device of claim 5 in which an upper portion of said side wall of said trench capacitor is constituted by a third insulating film having a thickness thicker than said dielectric film, and provided on said second capacitor electrode within said trench capacitor.

7. A memory device of claim 6 further comprising a highly doped impurity region of said first conductivity type provided on said third insulating film, having a higher impurity concentration than the impurity concentration of said substrate, and said highly doped impurity region acting as an isolation region.

8. A semiconductor memory device having a plurality of memory cells each including a transfer gate transistor and a trench capacitor coupled to said transfer gate transistor to form a dynamic access memory device comprising:

a semiconductor substrate of a first conductivity type having a major surface;

a plurality of trenches formed in said substrate from said major surface in an inward direction, and trench pairs being arranged in a column structure on said substrate, each of said trenches having an upper side wall surrounding an upper portion of said trenches and extending from said major surface of said substrate, a bottom wall and a lower side wall surrounding a lower portion of said trenches and positioned between said upper side wall and said bottom wall;

each of said transfer gate transistors having source and drain regions of a second conductivity type opposite to said first conductivity type and a channel region between said source and drain regions, formed on said major surface of said substrate, with one of said source and drain regions located on said trench capacitor;

a plurality of first impurity regions of said second conductivity type each having a ring shape formed at said lower side wall and at said bottom wall of said trenches such that said lower side walls and said bottom wall of said trenches are constituted by said impurity regions, and each of said pairs of trenches having said impurity regions connected to each other at their peripheral side part allowing all of said impurity regions in said column structure to be electrically connected to each other, so that a plurality of substrate sections of said first conductivity type remain between said column structures;

a first insulating film formed on said lower side wall and said bottom wall of said trenches;

an electrode comprising polycrystalline silicon formed within each of said trenches on said first insulating film leading-out to said major surface of said substrate and connected electrically to one of said source and drain regions, said electrode being isolated from said substrate of said first conductivity type;

a second insulating film comprising silicon oxide provided on said electrode at said upper side wall of said trenches and having a thickness thicker than said first insulating film;

a highly doped impurity region of said first conductivity type having a higher impurity concentration than said substrate and provided on said second insulating film;

whereby said trench capacitors of said memory cell are composed of said first impurity region as a first capacitor electrode, said electrode as a second capacitor electrode and said first insulating film as a dielectric film.

9. A memory device of claim 8 further comprising a leading-out means for said trench capacitors, said leading-out means being provided in each of said column structures consisting of pairs of said trench capacitor.

10. A memory device of claim 9, in which said leading-out means comprises an additional trench formed in said substrate from said major surface inwardly so that a lower side wall and a bottom wall of said additional trench are constituted by an additional first impurity region, said additional first impurity region being electrically connected to adjacent first impurity regions in said column structure at its peripheral side parts.

* * * * *

UNITED STATES PATENT AND TRADEMARK OFFICE
CERTIFICATE OF CORRECTION

PATENT NO. : 4,969,022

DATED : November 6, 1990

INVENTOR(S) : Shozo NISHIMOTO; Yasukazu INOUE and Hiroshi Kotaki

It is certified that error appears in the above-identified patent and that said Letters Patent is hereby corrected as shown below:

Col 1, line 53, delete "connect" and insert --connected--.

Col 5, line 27, delete "$N^+$-type" and insert --drain--;
line 28, delete "drain" and insert --$N^+$-type--.

Col 8, line 4, delete "constructi" and insert --construction--.

Col 9, line 29, delete "N" and insert --$N^+$--

Signed and Sealed this

Seventh Day of July, 1992

Attest:

DOUGLAS B. COMER

Attesting Officer

Acting Commissioner of Patents and Trademarks